US007462335B2

(12) United States Patent
Liu et al.

(10) Patent No.: US 7,462,335 B2
(45) Date of Patent: Dec. 9, 2008

(54) OPTICAL MONITORING AND CONTROL SYSTEM AND METHOD FOR PLASMA REACTORS

(75) Inventors: Lianjun Liu, Gilbert, AZ (US); Wayne L. Johnson, Phoenix, AZ (US)

(73) Assignee: Tokyo Electron Limited (JP)

( * ) Notice: Subject to any disclaimer, the term of this patent is extended or adjusted under 35 U.S.C. 154(b) by 125 days.

(21) Appl. No.: 10/259,845

(22) Filed: Sep. 30, 2002

(65) Prior Publication Data

US 2003/0038112 A1    Feb. 27, 2003

Related U.S. Application Data

(63) Continuation of application No. PCT/US01/10556, filed on Mar. 30, 2001.

(60) Provisional application No. 60/193,250, filed on Mar. 30, 2000.

(51) Int. Cl.
*B01J 19/12* (2006.01)
*H05B 31/48* (2006.01)

(52) U.S. Cl. .................... 422/186.05; 422/186.29; 315/111.21; 118/723 ER

(58) Field of Classification Search .......... 422/186.04, 422/186.05, 186.29; 118/723 E, 723 ER; 315/111.21
See application file for complete search history.

(56) References Cited

U.S. PATENT DOCUMENTS

| RE30,505 | E | 2/1981 | Jacob | |
|---|---|---|---|---|
| 4,383,885 | A | 5/1983 | Maydan et al. | |
| 4,948,458 | A | 8/1990 | Ogle | |
| 5,006,192 | A * | 4/1991 | Deguchi | 156/345.44 |
| 5,200,023 | A | 4/1993 | Gifford et al. | |
| 5,209,830 | A * | 5/1993 | Martens | 204/298.03 |
| 5,234,529 | A | 8/1993 | Johnson | |
| 5,691,642 | A | 11/1997 | Dobkin | |
| 5,733,511 | A * | 3/1998 | De Francesco | 422/186.05 |
| 5,811,820 | A * | 9/1998 | Kirchner et al. | 250/432 R |
| 6,017,437 | A | 1/2000 | Ting et al. | |
| 6,056,850 | A * | 5/2000 | Blalock et al. | 156/345.27 |
| 6,077,412 | A | 6/2000 | Ting et al. | |
| 6,863,020 | B2 * | 3/2005 | Mitrovic et al. | 118/723 E |

* cited by examiner

*Primary Examiner*—Thao T. Tran

(57) ABSTRACT

A method of adjusting plasma processing of a substrate in a plasma reactor having an electrode assembly. The method includes the steps of positioning the substrate in the plasma reactor, creating a plasma in the plasma reactor, monitoring optical emissions emanating from a plurality of different regions of the plasma in a direction substantially parallel to the surface of the substrate during plasma processing of the substrate, and determining an integrated power spectrum for each of the different plasma regions and comparing each of the integrated power spectra to a predetermined value. One aspect of the method includes utilizing an electrode assembly having a plurality of electrode segments and adjusting RF power delivered to the one or more electrode segments based on differences in the integrated power spectra from the predetermined value. Another aspect of the invention includes altering the flow of gas to different regions of the plasma in response to differences in the integrated power spectra detected by the fiber optic sensors. Several types of novel electrode assemblies suitable for carrying out the method of the invention are also disclosed.

5 Claims, 9 Drawing Sheets

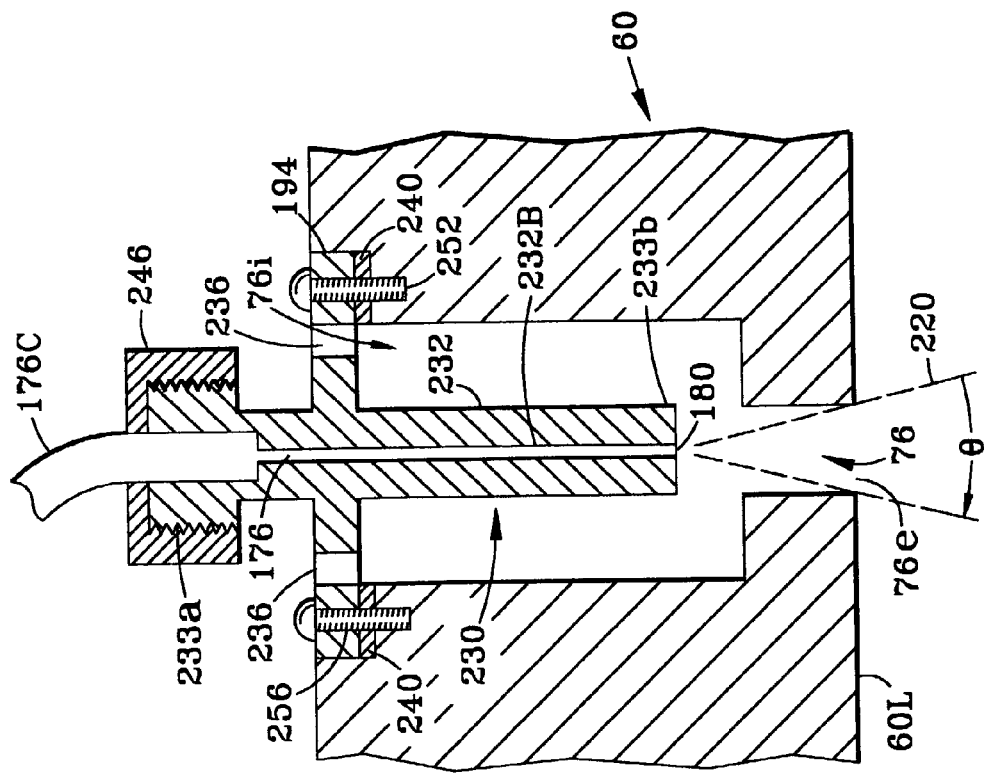
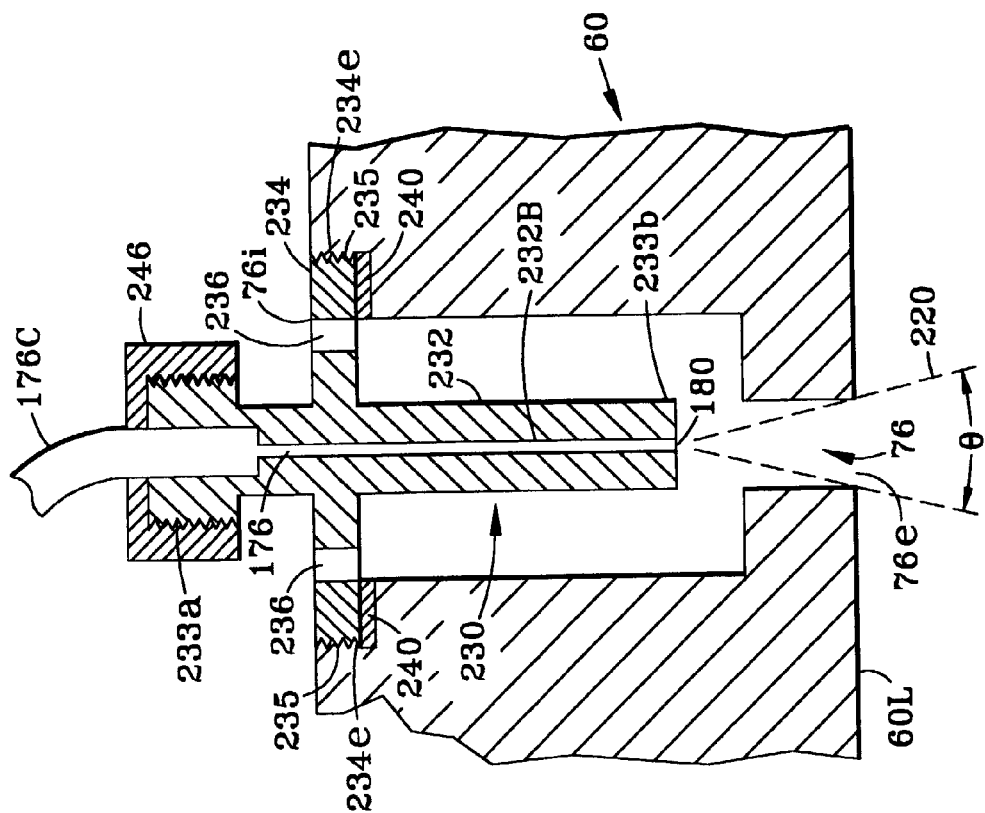

OPTICAL MONITORING AND CONTROL SYSTEM AND METHOD FOR PLASMA REACTORS

This application is a Continuation of International Application PCT/US01/10556, filed on Mar. 30, 2001, and claims the benefit of U.S. Provisional Application No. 60/193,250, filed Mar. 30, 2000, the contents of both of which are hereby incorporated by reference.

FIELD OF THE INVENTION

The present invention relates to plasma processing apparatus, and in particular to plasma reactor systems having an optical monitoring and control system for monitoring and controlling plasma processing.

BACKGROUND OF THE INVENTION

Ionized gas or "plasma" may be used during processing and fabrication of semiconductor devices, flat panel displays and in other industries requiring etching or deposition of materials. Plasma may be used to etch or remove material from semiconductor integrated circuit (IC) wafers, or to sputter or deposit material onto a semiconducting, conducting or insulating surface. Creating a plasma for use in a manufacturing or fabrication processes is typically done by introducing a low pressure process gas into a plasma chamber surrounding a work piece (substrate), such as an IC wafer. The molecules of the low-pressure gas in the chamber are ionized by a radio frequency (RF) energy (power) source to form a plasma which flows over the substrate. The plasma chamber is used to maintain the low pressures required for the plasma and to serve as a structure for attachment of one or more electrodes which serve as RF energy sources.

Plasma may be created from a low-pressure process gas by inducing an electron flow which ionizes individual gas molecules by transferring kinetic energy through individual electron-gas molecule collisions. Typically, electrons are accelerated in an electric field such as one produced by RF power. This RF power may have a low frequency (below 550 KHz), high frequency (13.56 MHz), or a microwave frequency (2.45 GHz).

Etching may be performed by plasma etching or reactive ion etching (RIE). A plasma etching system may include a single RF power source, or a plurality of such sources operating at one or more frequencies with a corresponding number of electrodes, at least one of which is located within the process chamber. A plasma is generated adjacent the substrate, the latter typically being co-planar with the electrode and supported by a substrate support member within the process chamber. The RF energy may be coupled to the plasma by capacitive means, by inductive means, or by both capacitive and inductive means. The chemical species in the plasma are determined by the source gas(es) used.

Plasma etching methods and apparatus using capacitive coupling are generally illustrated in U.S. Pat. Nos. Re. 30,505 and 4,383,885. A capacitively coupled plasma etching apparatus typically includes a lower electrode on which a semiconductor substrate or wafer is placed and an upper electrode opposing the lower electrode. The lower and upper electrodes are connected to respective RF power supplies. The upper electrode may be divided into a plurality of segments, each of which may be excited by a dedicated RF power supply. The RF power ionizes the source gas(es) and thereby produces a plasma. A range of radio frequencies may be used.

A method and apparatus using inductive coupling for obtaining a plasma for processing of IC wafers is described in U.S. Pat. No. 4,948,458. The plasma etching apparatus described includes an enclosure having an interior bounded at least in part by a RF transparent window. A planar coil is disposed proximate the window, and a RF energy source is coupled through an impedance matching circuit to the coil. The planar coil radiates the RF energy such that a planar magnetic field is induced in the interior of the enclosure. In alternate configurations, as, for example, in U.S. Pat. No. 5,234,529, the magnetic field is produced by a solenoidal coil that surrounds at least a part of a process chamber with walls that permit the magnetic field to pass into the process chamber. The magnetic field produces an electric field in accordance with Faraday's law. A plasma is generated thereby from the process gas. This plasma reacts with the surface of the semiconductor wafer, etching away material from the surface.

A plasma may also be used in chemical vapor deposition (CVD) to form thin films of metals, semiconductors or insulators (or, conducting, semiconducting or insulating materials) on a semiconductor wafer. Plasma-enhanced CVD uses the plasma to supply the required reaction energy for deposition of the desired materials. Typically, RF energy is used to produce this plasma.

Unfortunately, it is difficult to quickly assess the quality of the etching or deposition process in plasma processing. Presently, one of the main methods used to assess processing quality involves the rather tedious and costly steps of processing a wafer in the reactor, removing the wafer, and then examining the wafer to obtain the data necessary to determine the quality of a given plasma process. Furthermore, changes in the process due to equipment malfunctions, such as defects in mass flow controllers, almost always reduce process yields, and cannot generally be corrected until after test wafers have been processed and examined, which is a time consuming and expensive proposition.

It would be beneficial, therefore, to have an in situ monitoring system capable of providing information about the quality of the plasma processing in a plasma reactor system.

Optical emission spectroscopy is a method currently used to detect a process endpoint in plasma etching systems. This technique is in situ and is possible because the plasma excites certain atomic and molecular species present in the plasma and causes them to emit light of wavelengths that are characteristic of the species being etched.

In an optical monitoring system for performing optical emission spectroscopy, specific wavelengths of the light emitted from the plasma are selected and fed to detectors, such as photodiodes, photomultipliers, and array detectors, which convert the light intensities into electrical signals. It is known that the intensity of the detected raw signals is related to the level of light detected. By selecting wavelengths which correlate to the reaction products of the particular process, the process may be monitored either at specific wavelengths or at all wavelengths by a spectral scan. In particular, by selecting a wavelength which corresponds to the emissions generated by the layer below the layer which is being etched, the point at which that layer is reached may be easily detected. When the film being etched has been completely removed from the underlying material or film, there is a change in the chemical composition of both the gas phase and the remaining film. Product species from the etched film are no longer being generated, and the concentration of some reactants increases because they are no longer being consumed by the reaction. These chemical changes show up as changes in optical emission intensities. Thus, by continuously monitoring the intensity of an appropriate emission feature (i.e., either a reactant consumed in or a product of the etch reaction), a change in emission intensity generally signals removal of the film being etched and contact of the etching agent with the underlying material or film. This change signals the process endpoint and may either be the result of an increase in reactant emission, a decrease in product emission or the presence of another reactant emission.

A patent which discloses an apparatus and method for performing plasma characterization in a plasma process is U.S. Pat. No. 5,691,642 (the '642 patent), the disclosure of which is incorporated herein by reference. Specifically, the '642 patent describes a method and apparatus for accurately characterizing the electron density and distribution of a confined plasma on the basis of high-frequency, broadband electromagnetic measurements. The technique involves noninvasive, broadband measurement of electromagnetic transmission through the plasma. In one implementation, multivariate analysis techniques are employed to correlate features of the resultant spectra with plasma characteristics such as electron density or electron distribution. Alternately, such techniques are used to correlate the resultant spectra with parameters relating to conditions under which the plasma is generated. More specifically, the quantitative plasma characterization technique involves generating a set of broadband calibration spectra by measuring transmission of electromagnetic energy through a calibration plasma. Each broadband calibration spectrum is obtained using a different set of reference parameters being related to predefined quantitative characteristics. The reference parameters may comprise known values of quantitative characteristics of the calibration plasma including, for example, electron distribution or electron density. Alternately, the reference parameters may comprise known values of operating conditions within the chamber bearing a predetermined empirical relationship to particular plasma quantitative characteristics. A reference parameter transformation, which relates measured spectra of electromagnetic energy transmitted through the calibration plasma to values of the reference parameters, is derived on the basis of the broadband calibration spectra. A test spectrum is then obtained by measuring transmission of electromagnetic energy through the subject plasma. Values of the predefined quantitative characteristics of the subject plasma are then determined by analyzing the test spectrum using the reference parameter transformation.

However, a major shortcoming of the invention disclosed in the '642 patent is the need to measure the transmission of electromagnetic energy at microwave wavelengths through the plasma, which is a relatively complex process. Another shortcoming is that the disclosed method and apparatus do not provide information about variation in the plasma across the wafer, so that corresponding cross-wafer variations in plasma processing are not detectable.

U.S. Pat. No. 5,200,023 describes an infrared television camera that monitors the etching of a substrate in-situ in an etch chamber. Temporal and spatial resolutions of IR emissions are obtained by monitoring the top surface of the substrate in two-dimensions throughout the course of the etching process. Anomalies in temperature detected on the top surface of the substrate can indicate defects in the substrate itself or in the operation of the etching apparatus. Process feedback control is achieved by adjusting various parameters of the etching apparatus (i.e., gas-pressure, flow pattern, magnetic field, coolant flow to electrode, or the like) to compensate for etching anomalies. Etch uniformity and etch endpoint monitoring is achieved by monitoring the IR emissions resulting from exothermic reaction of the film being etched. IR emissions decline at the end of an exothermic etch reaction. Particulate matter suspended in the plasma, which might harm the substrate, can be identified with a second IR television camera, which images the region above the substrate. Particulate matter appears as localized "hot spots" within the gas plasma, and the identification of particulate matter allows corrective measures to be taken. However, the invention described in U.S. Pat. No. 5,200,023 detects just IR radiation, which is only a limited part of the spectrum of light emitted by the plasma. This limits the amount of information about the across-wafer variations in the plasma processing that can be obtained.

BRIEF SUMMARY OF THE INVENTION

The present invention relates to plasma processing apparatus, and in particular to plasma reactor systems having an optical monitoring and control apparatus for monitoring and controlling plasma processing.

A first aspect of the invention is a method for monitoring plasma processing of a substrate with a surface in a plasma reactor having an electrode. The method comprises the steps of positioning the substrate in the plasma etch reactor, then creating a plasma in the plasma etch reactor, then monitoring optical emissions emanating from a plurality of different regions of the plasma in a direction parallel to the surface of the substrate during plasma processing of the substrate, and then determining an integrated power spectrum for each of the different plasma regions and comparing each of the integrated power spectra to a predetermined value.

A second aspect of the invention is a method for adjusting plasma processing by carrying out the steps as described immediately above, wherein the electrode comprises a plurality of electrode segments capable of having power delivered thereto, and further including the step of adjusting the RF power delivered to one or more of the electrode segments based on differences in the integrated power spectra from the predetermined value.

A third aspect of the invention is the method as described in the first aspect of the invention, wherein the flow of gas is adjusted to different regions of the plasma based on differences in the integrated power spectra from the predetermined value.

A fourth aspect of the invention is an electrode assembly for a plasma reactor system for processing a substrate with a plasma. The electrode assembly comprises a plurality of substantially planar electrode segments arranged adjacent and substantially parallel to the substrate. Insulating members are arranged between the electrode segments, each having a sensor bore formed therein. The electrode assembly also includes a plurality of fiber optic sensors each having first and second ends, with the second ends held within respective sensor bores such that the second ends receive light from respective regions of the plasma.

A fifth aspect of the invention is an electrode assembly for a plasma reactor system for processing a substrate with a plasma. The electrode assembly comprises a planar electrode body having upper and lower substantially planar surfaces with a plurality of through-bores connecting the upper and lower surfaces, through which gas can flow. The assembly also includes two or more fiber optic support members respectively arranged in corresponding two or more of the bores, each of the members capable of holding a fiber optical sensor within the bore such that the fiber optical sensors receive light from the plasma.

A sixth aspect of the invention is an electrode assembly for a plasma reactor system for processing a substrate with a plasma. The electrode assembly comprises an electrode body having a lower surface, and a plurality of adjustable nozzle units arranged along the electrode body lower surface. The nozzle units are for controlling the flow of gas through the electrode assembly. Each nozzle unit has a nozzle plug with a tip, and a nozzle bore passing through the nozzle plug and the tip. The assembly includes a plurality of fiber optic sensors, each held in one of the nozzle bores such that the fiber optic sensors can receive light from the plasma through the tip.

A seventh aspect of the invention is a plasma processing system that includes the above-described electrode assemblies.

BRIEF DESCRIPTION OF THE SEVERAL VIEWS OF THE DRAWING

FIG. 5A is a close-up cross-sectional schematic diagram of a first arrangement of a fiber optic sensor and sensor support member for supporting the fiber optic sensor end in one of the bores of the shower-head type electrode assembly of FIG. 3A;

FIG. 5B is a close-up cross-sectional schematic diagram of a second arrangement of a fiber optic sensor and sensor support member for supporting the fiber optic sensor end in one of the bores of the shower-head type electrode assembly of FIG. 3A;

DETAILED DESCRIPTION OF THE INVENTION

The present invention relates to plasma processing apparatus, and in particular to plasma reactor systems having an optical monitoring and control apparatus for monitoring and controlling plasma processing.

The present invention is an apparatus and method that enables real-time monitoring and control of a plasma reactor system by using an array of fiber optic sensors to monitor the emitted light from the plasma. The fiber optic sensors are arranged relative to the wafer so that the optical emissions from the plasma are integrated along a multiplicity of lines within a certain view angle $\theta$ (see FIG. 9), which may be nominally perpendicular to the wafer surface, if the view angle is not too large. These measurements are then fed back to a control system that controls the process to ensure process stability. The array of sensors can be aligned so that their respective lines of view lie in a plane to discretely monitor regions of a plane or sheet in the plasma. The monitoring system associated with the present invention is also designed to avoid interfering with gas flow from the gas inlets (e.g., bores, nozzles, etc., described below) to within the chamber interior.

Figure 1:
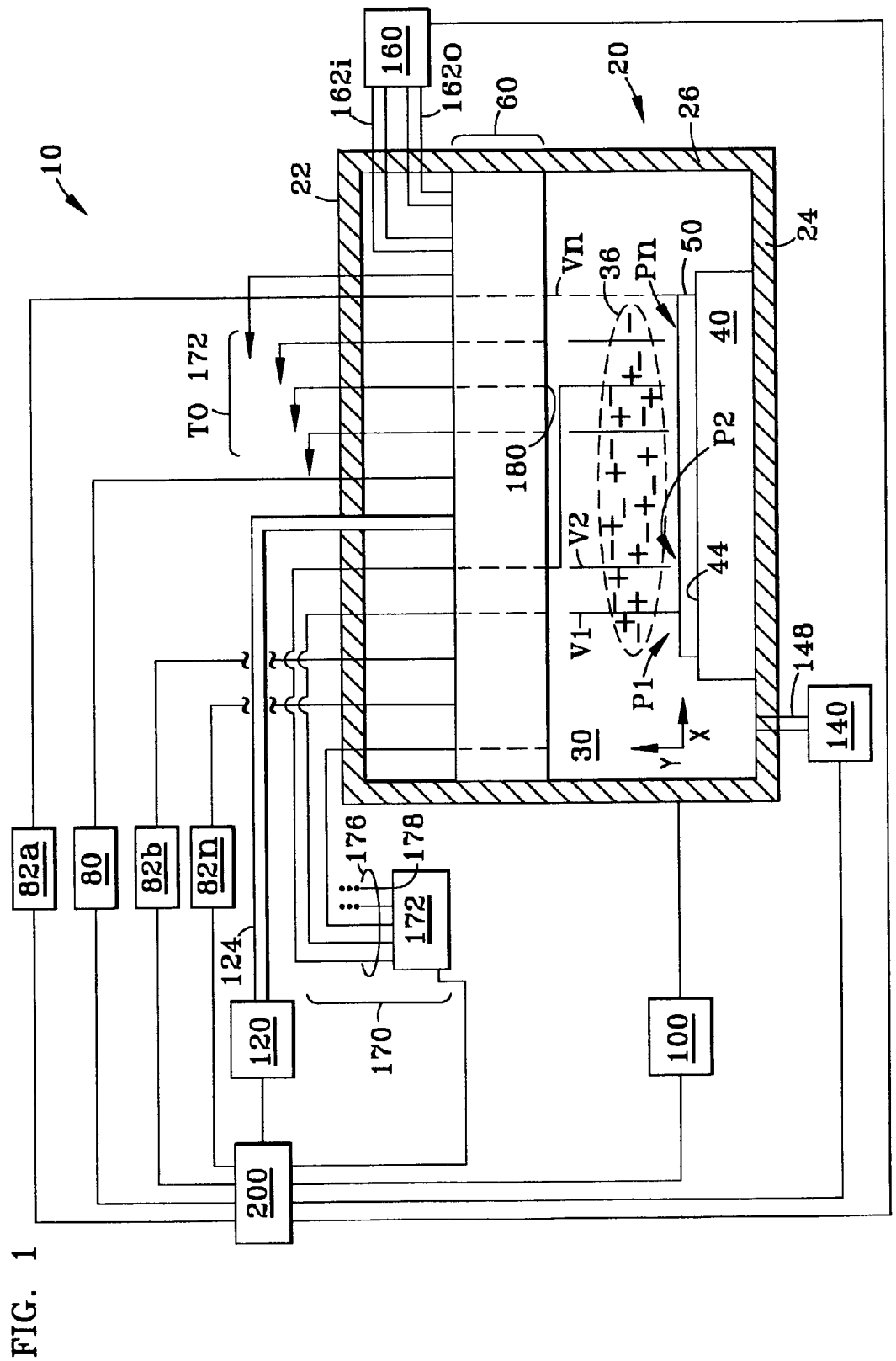
FIG. 1 is a schematic diagram of a plasma reactor system and a plasma optical monitoring system of the present invention

With reference now to FIG. 1, plasma reactor system 10 comprises a plasma chamber 20 having an upper wall 22, a lower wall 24 and sidewalls 26 defining an interior region 30 capable of supporting a plasma 36. System 10 further includes a substrate pedestal 40 within interior region 30 and having an upper surface 44 upon which a substrate (wafer) 50 is supported. System 10 also includes an electrode assembly 60 arranged within interior region 30 above substrate pedestal 40.

Figure 2A:
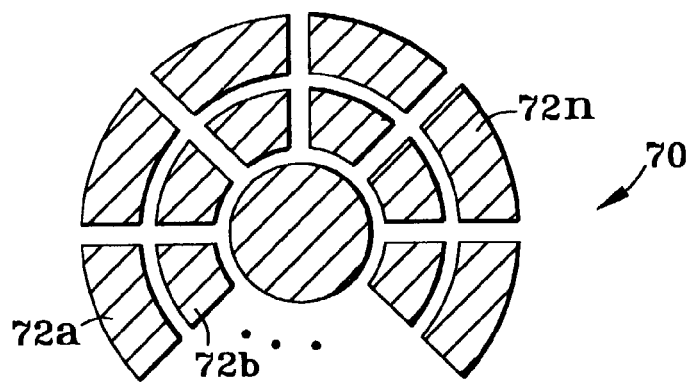
FIG. 2A is a plan view of an exemplary segmented electrode having n electrode segments.
Figure 2B:
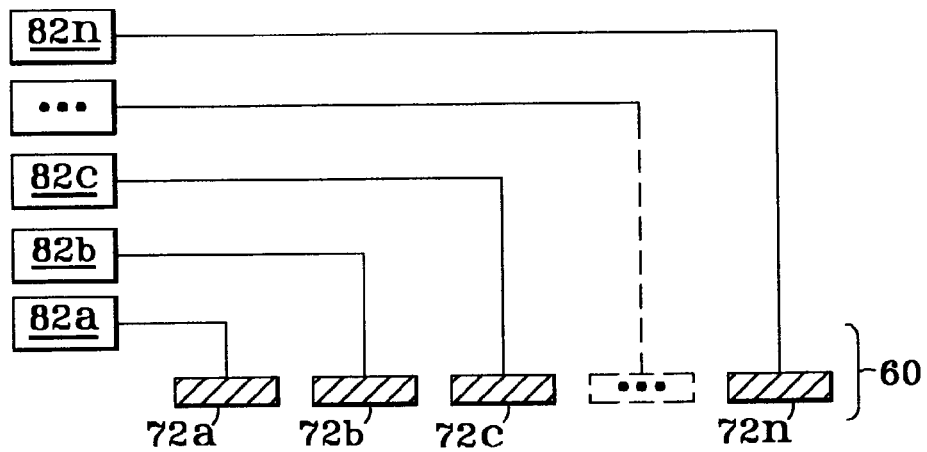
FIG. 2B is a schematic diagram of an electrode assembly suitable for use in the present invention, in which the electrode assembly comprises an upper segmented electrode adjacent the plasma, with the electrode segments electronically connected to respective RF power supply systems.

With reference to FIGS. 2A and 2B, an upper electrode assembly 60 may comprise, in a first embodiment, a plurality of electrode segments 72a, 72b, 72c, ..., 72n. The electrode segments are electrically insulated from each other and can be independently powered from separate RF power sources. Each electrode segment can be independently cooled by fluid that circulates within it and independently supplied with gas (es) for injection into the process chamber. An exemplary electrode assembly 60 having adjustable powered segmented electrodes as shown in FIGS. 2A and 2C is also described in co-pending Provisional U.S. Patent Application No. 60/185, 069, filed Feb. 25, 2000, and entitled MULTIZONE RF ELECTRODE FOR FIELD/PLASMAS UNIFORMITY CONTROL IN CAPACITIVE PLASMA SOURCES, which patent application is incorporated by reference herein.

Figure 2C:
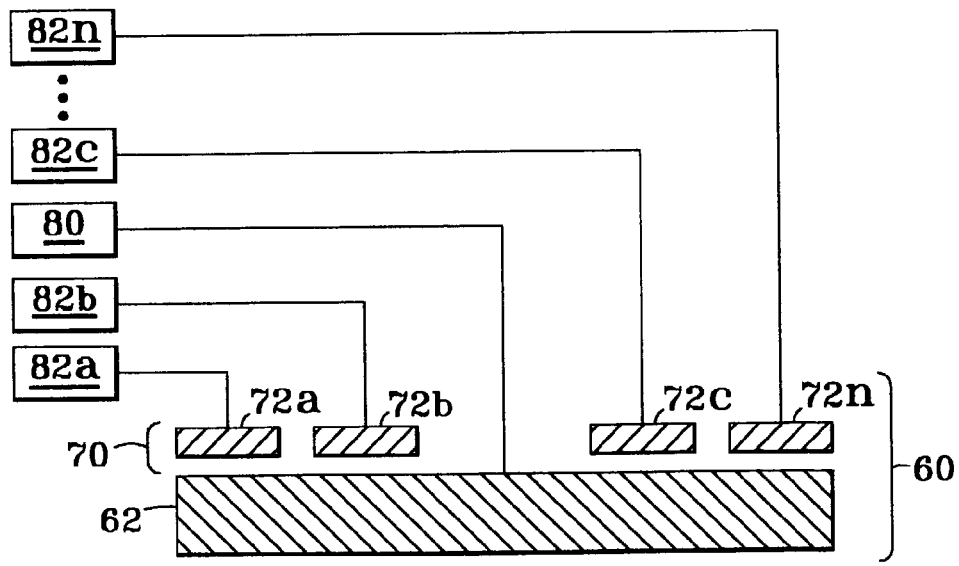
FIG. 2C is a schematic diagram of an electrode assembly suitable for use in the present invention, in which the electrode assembly comprises an upper electrode adjacent the plasma and a segmented electrode adjacent the upper electrode opposite the plasma, with the electrode segments of the segmented electrode electronically connected to respective RF power supply systems and capacitively coupled to the upper electrode.

With reference to FIG. 2C, electrode 60 may comprise, in a second embodiment, an upper electrode 62 and a segmented electrode 70 having multiple electrode segments 72a, 72b, ... 72n. Electrode assembly 60 may also have an electrode chamber (not shown) through which fluid may be circulated to cool the electrode assembly. An exemplary electrode assembly 60 having adjustable segmented electrodes is also described in U.S. Provisional Patent Application Serial No. 60/175,284, filed Jan. 10, 2000, and entitled SEG- MENTED ELECTRODE APPARATUS AND METHOD FOR PLASMA PROCESSING, which patent application is incorporated by reference herein. Alternatively, electrode assembly 60 may comprise a segmented electrode having a plurality of electrode segments, such as electrode 400 of FIG. 9, discussed in greater detail below.

Figure 3A:
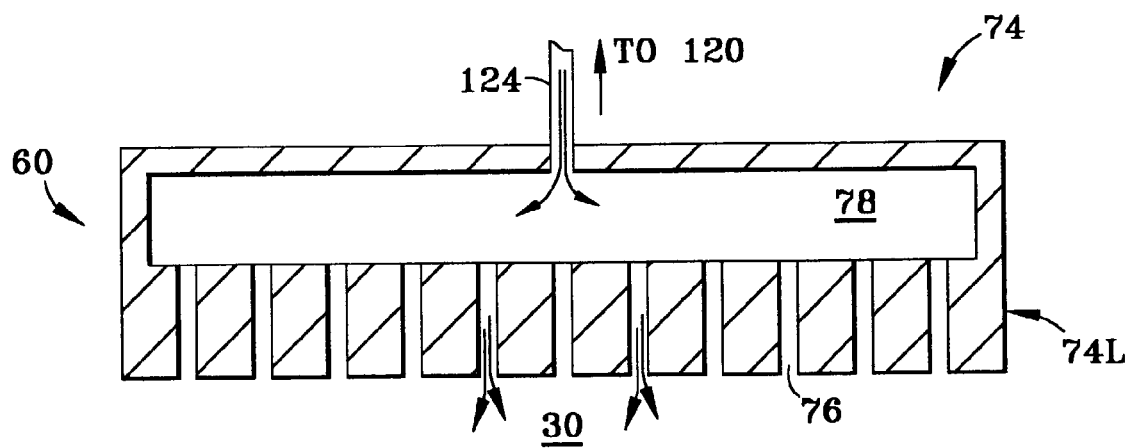
FIG. 3A is a cross-sectional schematic diagram of a prior art single shower-head type electrode assembly, which includes an electrode chamber.
Figure 3B:
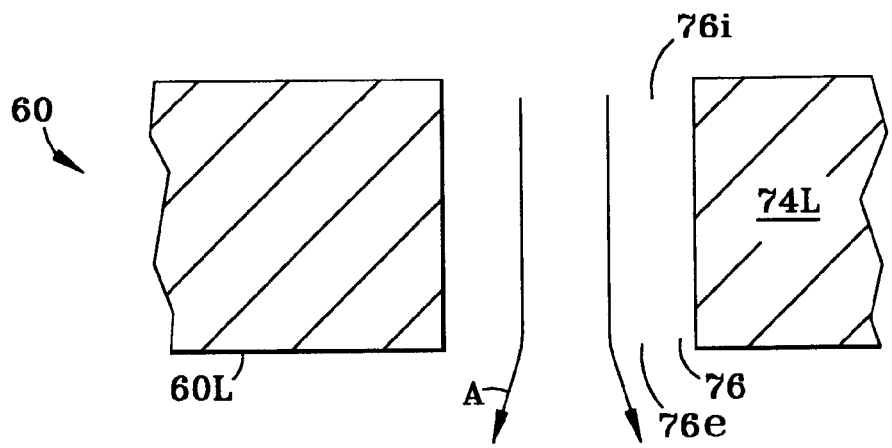
FIG. 3B is a close-up view of one of the bores in the shower-head type electrode assembly of FIG. 3A, with arrows depicting the flow of gas through the bore.

For the sake of simplicity, and for the purposes of describing the present invention, electrode assembly 60 may be that shown in FIGS. 3A and 3B, i.e., a single electrode 74 having a "shower head" lower body (portion) 74L interfacing with interior region 30 and having a plurality of gas injection bores 76 having a gas input end 76i and a gas exit end 76e, and which extend from interior region 30 into an electrode gas chamber 78 in pneumatic communication with a gas supply system (discussed further below). The flow of gas through bore 76 of electrode 74 is indicated by arrows A.

With reference again to FIG. 1, system 10 further includes RF power supply systems 80 and 82a, 82b, . . . 82n in respective electrical communication with, for example as shown in FIG. 2C, upper electrode 62 and electrode segments 72a, 72b, . . . 72n, of electrode assembly 60.

With continuing reference to FIG. 1, system 10 further includes a wafer handling/robotics system 100 in operative communication with plasma chamber 20, for placing and removing substrates 50 onto and from substrate pedestal 40. Also included is a gas supply system 120 in pneumatic communication with chamber 20 via a gas supply line 124 connected to electrode assembly 60, for supplying gas to chamber interior region 30 to purge the chamber and to create plasma 36. Gas supply line 124 may be, for example, connected to electrode gas chamber 78 (FIG. 3A). The particular gases included in gas supply system 120 depend on the particular plasma processing application. However, for plasma etching applications, gas supply system 120 preferably includes such gases as chlorine, hydrogen-bromide, octafluorocyclobutane, and various other fluorocarbon compounds, etc., and for chemical vapor deposition applications, preferably includes silane, ammonia, tungsten-tetrachloride, titanium-tetrachloride, and the like.

Further included in system 10 is a vacuum system 140 in pneumatic communication with chamber 20 via a vacuum line 148. Also preferably included is a cooling system 160 in fluid communication with electrode assembly 60 through chamber upper wall 22 via an input fluid line 162i and an output fluid line 162o, for circulating a cooling fluid into and out of the electrode chamber within electrode assembly 60.

System 10 also includes a sensor array system 170 comprising a sensor detector array 172 (FIG. 4) with fiber optic sensors 176 each having first end 178 coupled to the sensor detector array and a second end 180 integrated into electrode assembly 60 and arranged to receive optical emissions (i.e., light) from plasma 36 in interior region 30 and to relay this light to the sensor detector array. Fiber optical sensor 176 may include, for example, a single strand of single or multi-mode optical fiber surrounded by a jacket 176c (see FIG. 5A). Jacket 176c may be constituted by a product marketed under Part Number C309002BST available from Perkin-Elmer, Inc. Fiber optical sensors 176 are arranged in chamber 20 so that ends 180 receive light that has been integrated through plasma 36 in a direction generally perpendicular to the surface of wafer 50, as indicated by vertical lines V1, V2, . . . Vn. In particular, the optical emissions from plasma 36 are integrated along a multiplicity of paths, which are closer to perpendicular relative to the wafer surface as view angle θ decreases (see FIG. 5A). The plurality of fiber optical sensors 176 so arranged provides for a two-dimensional optical characterization of plasma 36 in a direction parallel to (i.e., across) the wafer surface corresponding to a plurality of across-wafer portions P1, P2, . . . Pn.

Figure 4:
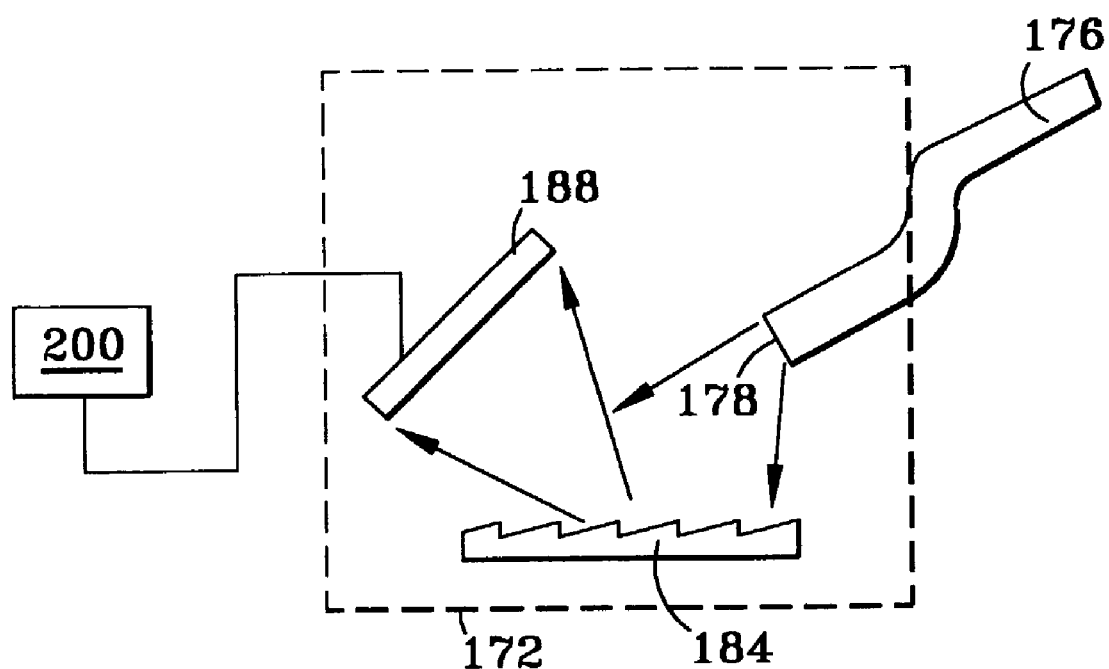
FIG. 4 is a schematic diagram of the sensor array detector of the plasma optical monitoring system of FIG. 1.

With reference to FIG. 4, sensor detector array 172 comprises a light-dispersive element 184, such as a diffraction grating, and a detector array 188 capable of generating an electrical signal in response to light incident thereon. Detector array 188 may be, for example, a known device such as a CCD or photodiode array. Light-dispersive element 184, detector array 188 and fiber optical sensor end 178 are arranged so that light emanating from sensor end 178 is incident on element 184 in such as way as to disperse the light into its wavelength components and onto detector 188.

With reference again to FIG. 1, system 10 also includes a main control system 200, which is in electronic communication with and which controls the operation of gas supply system 120, vacuum system 140, wafer handling/robotics system 100, cooling system 160, sensor detector array system 170, and RF power supply systems 80 and 82a, 82b, . . . 82n, through respective electronic signals. Main control system 200 thus controls the monitoring and the operation of plasma processing of substrates 50 in system 10, as described below. An exemplary main control system 200 is a computer having a memory unit and a processor, such as a PENTIUM™ processor, as well as data acquisition and control capability. A suitable computer for control system 200 is a DELL PRECISION WORKSTATION 610™, available from Dell Corporation, Dallas, Tx.

Each detector array 172 and the portion of control system 200 associated with a respective array 172 can be constructed in the manner disclosed in U.S. Pat. No. 4,357,195, which issued to Gorin in 1982.

With reference now to FIG. 5A, there is shown a first embodiment of the present invention for use with bores 76 in an existing injection electrode assembly 60. Bore 76 is modified (e.g., widened, except for the portion near gas exit end 76e) to allow insertion of a fiber optic sensor support member (described below) without unduly restricting the flow of process gas(es) through bore 76. The latter is preferably modified at input end 76i to have a two-step counter bore, although a tapered bore could be used. A fiber optic sensor support member 230 is used to support fiber optic sensor 176 within the bore. Support member 230 comprises a cylindrical body 232 with an axial bore 232B passing therethrough, with distal and proximate ends 233a and 233b, respectively. Proximate end 233a preferably constitutes an industry standard threaded SMA bulkhead receptacle. Support member 230 also includes a mounting plate 234 extending radially from body 232 near its middle. Mounting plate 234 includes a plurality of apertures 236 through which process gas(es) can pass from gas chamber 78 into bore 76 when support member 230 is fixed within bore 76. The size and number of apertures 236 in mounting plate 234 are chosen so that the gas flow through bore 76 is essentially the same as it was before being modified to accept optic sensor 176 and support member 230.

With continuing reference to FIG. 5A, in a preferred embodiment, mounting plate 234 has an outer edge 234e that is threaded. Likewise, input end 76i of bore 76 preferably includes a threaded indent 235 to matingly receive outer edge 234e of mounting plate 234. The distance between end 180 of fiber optic sensor 176 and lower surface 60L of electrode assembly 60 can be adjusted by screwing fiber optic sensor support member 230 in or out of threaded indent 235. Shims 240 may be placed between support member 230 and electrode assembly 60 at threaded indent 235 to assure a secure adjustment.

Fiber optic sensor 176 is supported in member 230 using any one of a variety of well-known techniques (e.g., using an epoxy resin).

Fiber optic sensor support member 230 is preferably recessed at end 233a and threaded on the exterior cylindrical surface proximate end 233a to make fiber optic sensor support member 230 compatible with an industry standard SMA patchcord (not shown), such as those available from OZ Optics, Ltd. An industry standard SMA patchcord includes a threaded nut 246 that connects fiber optic sensor 176 with a jacket 176C to fiber optic sensor support member 230. The use of such adapters and connectors is well known to persons of ordinary skill in the art.

Preferably, sensor 176 does not pass all the way through bore 76 to gas exit end 76e and into interior region 30. This is so sensor end 180 remains away from plasma 36. The view angle θ of sensor 176 is determined by the numerical aperture of the fiber (indicated by dashed lines 220), though it may be limited by the size of the bore at output end 76e.

With reference to FIG. 5B, a second embodiment of the present invention for use with a bore 76 in an existing injection electrode assembly 60 is similar to that shown in FIG. 5A In the present embodiment, known mounting means, such as a plurality of screws 250, are used to mount fiber optic sensor support member 230 on electrode assembly 60 using threaded mounting holes 256 also formed in mounting plate 234, and corresponding threaded mounting holes 252 formed in electrode assembly 60. The penetration of fiber optic sensor 176 into bore 76 may be adjusted, if necessary, by placing shims 240 between fiber optic sensor support member 230 and electrode assembly 60, as described above in connection with FIG. 5A.

Figure 5C:
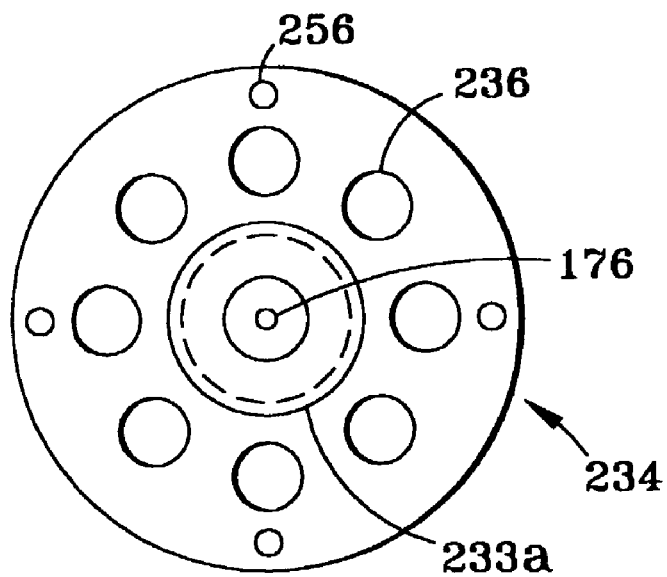
FIG. 5C is a plan view of the fiber optic support member shown in FIG. 5B.

With reference to FIG. 5C, a view of the fiber optic sensor support member 230 of FIG. 5B as seen from above illustrates the relative placement of mounting holes 256 and gas injection holes 236.

Figure 5D:
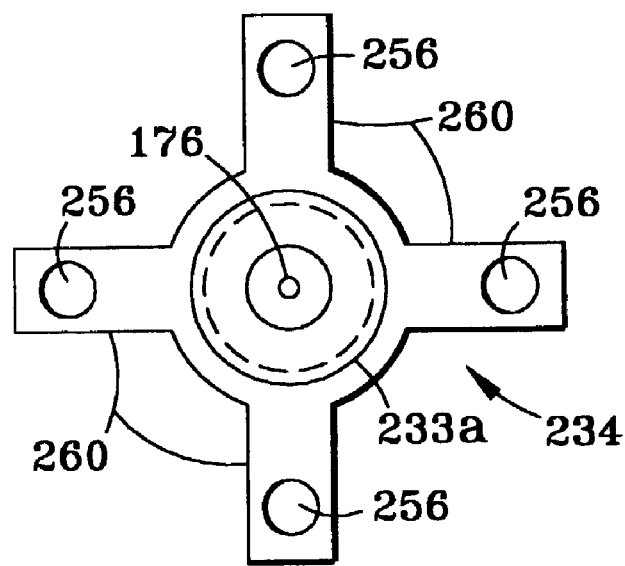
FIG. 5D is a plan view of an alternate configuration of the fiber optic support member shown in FIG. 5C.

With reference now to FIG. 5D, another embodiment of fiber optic sensor support member 230 is shown as seen from above. In this embodiment, fiber optic sensor support member 230 has a mounting plate 234' having a plurality of spokes 260, each of which includes a mounting hole 256. In this embodiment, gas inlet holes 236 are not required, as the gas can flow into bore 76 through the space between spokes 260.

Figure 6:
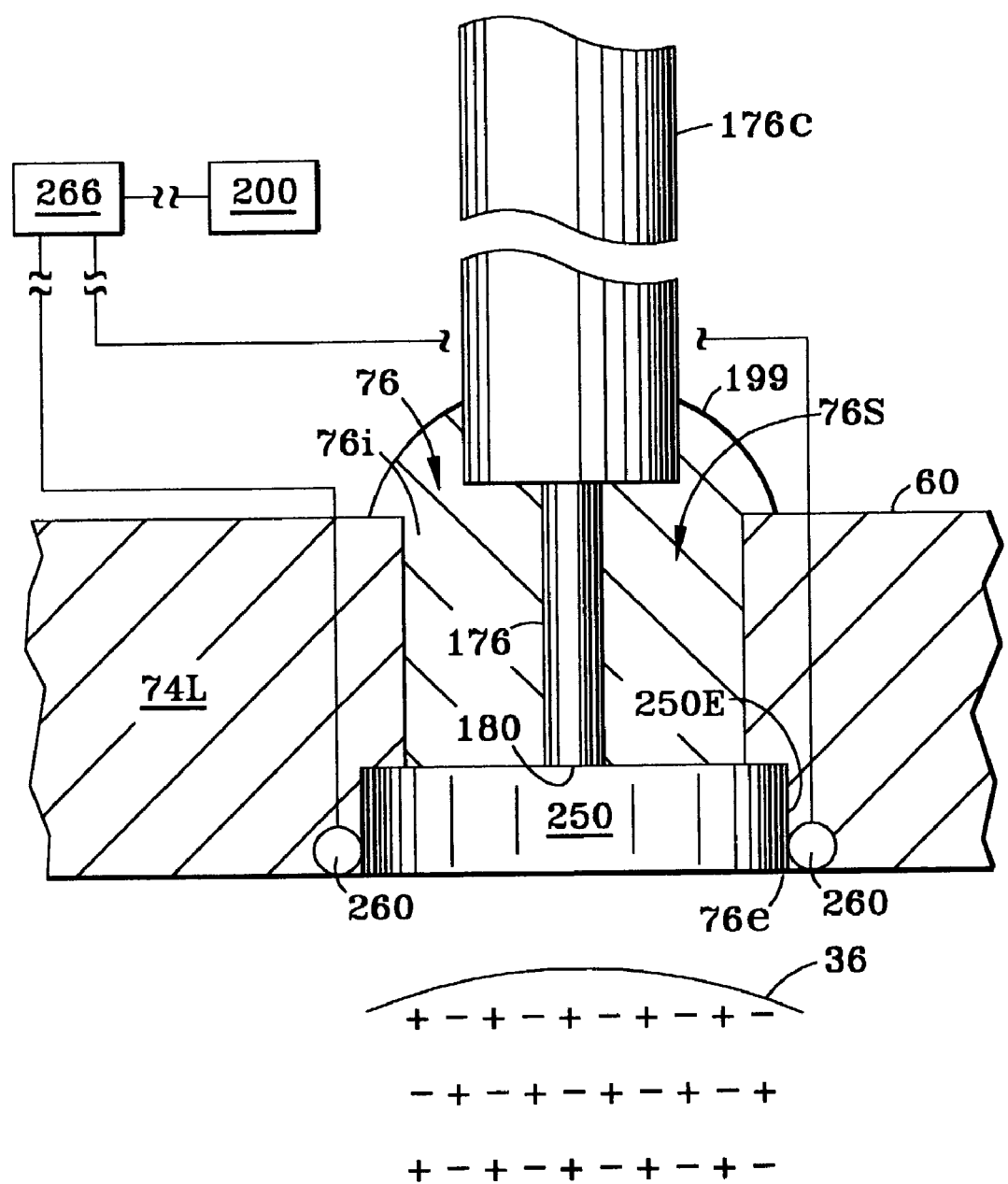
FIG. 6 is a cross-sectional schematic diagram of a second arrangement of a fiber optic sensor with its end in one of the bores of the shower-head type electrode assembly of FIG. 3A, wherein the fiber optic sensor end is attached to a transparent window fixed to the gas exit end of the bore.

With reference now to FIG. 6, an alternative way of supporting fiber optic sensor 176 and securing the sensor within bore 76 is to secure end 180 of the sensor to a transparent window 250 having an edge 250E, placed over the bore at gas exit end 76e. It may be desirable to fill the space 76S between optical sensor 176 and the walls of bore 76 with a suitable bonding medium or adhesive 199, such as an epoxy resin, or a plastic (e.g., TEFLON®) sleeve or collar to assure that optical sensor 176 is held securely in place. Transparent window 250 may be, for example, a piece of quartz glass or fused silica. Though the placement of window 250 blocks the flow of gas through bore 76, only a few, and perhaps on the order of ten bores need be blocked. An advantage of the present alternative is that it makes use of existing electrode assemblies.

As also known in FIG. 6, window 250 may optionally be heated using heating elements 260 arranged adjacent window edge 250E and electronically connected to a heating unit 266, which is in electronic communication with control system 200. Heating of window 250 minimizes the accumulation of material on the window due to the window being adjacent plasma 36.

Figure 7:
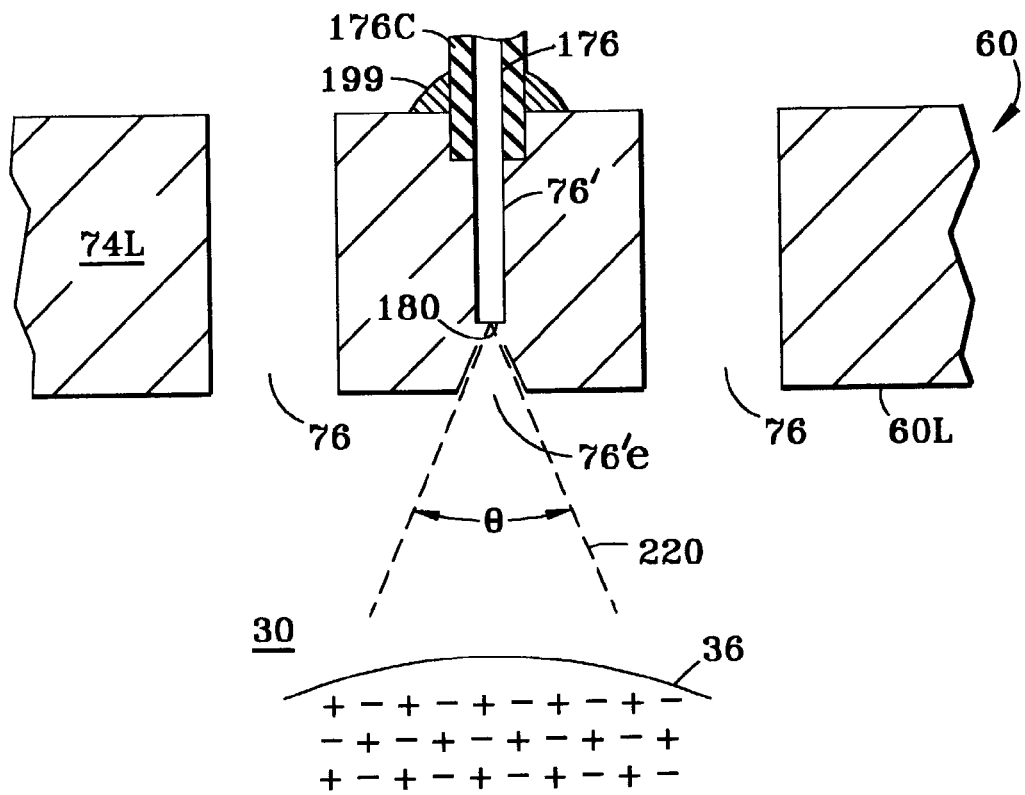
FIG. 7 is a cross-sectional schematic diagram of a third arrangement of a fiber optic sensor in a sensor bore of an electrode assembly, wherein the sensor bore is sized to fit the fiber optic sensor and optionally includes a tapered end to accommodate the numerical aperture (view angle) of the sensor.

Alternatively, with reference now to FIG. 7, additional sensor bores 76' for the express purpose of accommodating sensors 176 are formed into lower portion 74L of electrode assembly 60. Sensor bores 76' are preferably sized to engage sensors 176 to facilitate mounting. In a first embodiment, optic fiber sensor 176 is prepared for installation in one of bores 76'. For a sensor 176 surrounded by a protective jacket 176C having a thickness of say 3 mm, this process involves removing of this thickness from about 1 to 2 mm of the length of sensor 176 near end 180. This process exposes strength members in jacket 176C, usually KEVLAR®, which may be removed or left in place. The nominally 0.9 mm OD fiber buffer is not removed. Thus prepared, fiber optic sensor 176 is inserted into bore 76', which has a diameter of approximately 1 mm. Fiber sensor 176 is held in place in electrode 60 by a suitable bonding medium 199, such as an epoxy resin. Sensor bores 76' may optionally include a tapered end 76'e adjacent plasma 36 designed to accommodate view angle θ of fiber optic sensor 176.

Figure 8:
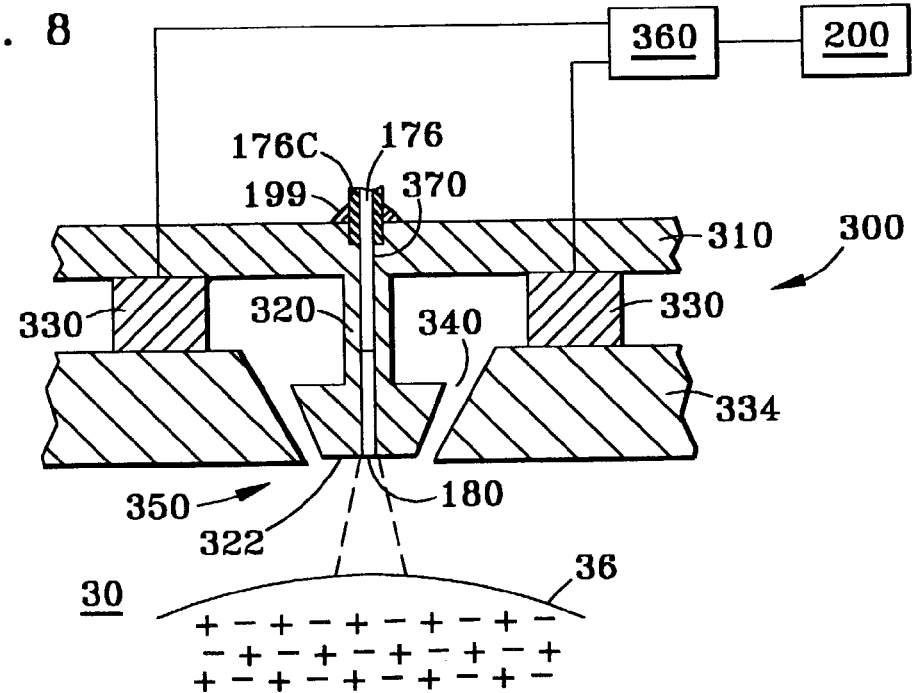
FIG. 8 is a cross-sectional schematic diagram of a fourth arrangement of a fiber optic sensor included in an electrode assembly, wherein the fiber optic sensor end is incorporated into a nozzle plug that is part of an adjustable nozzle unit.

With reference now to FIG. 8, an alternative electrode 300 suitable for application of the present invention is shown. Electrode 300 includes a back plate 310 having nozzle plugs 320 with nozzle tips 322, extending outwardly from the back plate toward interior region 30. Attached to back plate 310 on either side of nozzle plug 320 are displacement actuators 330. An inject plate 334 having bores 340 is attached to displacement actuators 330 such that nozzle plugs 320 extend into bores 340, thereby forming nozzle units 350. Displacement actuators 330 are in electronic communication with a displacement actuator control system 360, which drives displacement actuators 330 so as to vary the degree to which nozzle plugs 320 extend into bores 340 and thereby alter the area of the throat through which the gas passes between the plugs 320 and the bores 340, thereby adjusting the gas flow into interior region 30. Displacement actuator control system 360 is also in electronic communication with control system 200, which controls the actuator control system to adjust the processing of substrate 50 by controlling the flow of gas into different regions of plasma reactor chamber interior 30.

For example, when the nozzle plug 320 is displaced downward into tapered bore 340, the gas flow rate is decreased due to the reduction of the cross-sectional area of the orifice throat (i.e., the smallest cross-sectional area of the gas passageway determined by the nozzle 320 and tapered bore 340). Conversely, if nozzle plug 320 is displaced upward out of tapered bore 340, the gas flow rate can be increased. This is, of course, if nozzle plug 320 is or a group of nozzle plugs 320 are displaced relative to another nozzle plug or group of nozzle plugs, all of which are fed gas through the same mass flow controller (not shown). In this way, the mass flow through a single nozzle or a group of nozzles can be varied relative to that of a separate nozzle or group of nozzles. Moreover, this way the relative gas flow introduced over separate, selected areas of the substrate can be controlled. The use of adjustable nozzles to alter the gas flow rate and/or gas expansion is addressed in a concurrently filed, co-pending U.S. Provisional Patent Application by STRANG, entitled METHOD AND APPARATUS FOR TUNABLE GAS INJECTION IN A PLASMA PROCESSING SYSTEM, application Ser. No. 60/193,231, the disclosure of which patent application is incorporated by reference herein.

Back plate 310 and nozzle plug 320 include a through nozzle bore 370 through which fiber optic sensor 176 is fed so that end 180 of the sensor resides at or near nozzle plug tip 322 and is positioned so as to receive light from plasma 36 in interior region 30 in the manner described above.

Fiber optic sensor 176, sensor array detector 172 (comprising light dispersing element 184 and detector array 188), and controller 200 constitute a plasma optical monitoring system.

The operation of system 10 and the plasma monitoring system and method of the present invention is now described. With reference again to FIG. 1, control system 200 activates wafer handler/robotics system 100 so that a substrate (wafer) 50 to be processed is placed on surface 44 of substrate pedestal 40. Control system 200 then activates vacuum system 140, which pumps down interior region 30 to a low pressure suitable for forming a plasma 36 and carrying out plasma processing of wafer 50 at a low pressure (e.g., from about 1 mTorr to 1000 mTorr). Once a suitable pressure is reached in interior region 30, control system 200 activates gas supply system 120, which supplies gas through gas line 124 and to interior region 30. The gas may flow through bores 76 in electrode assembly 60, such as shown in FIGS. 3A and 5A. Then, where electrode assembly 60 includes a segmented electrode and an upper electrode such as shown in FIG. 2B, control system 200 then activates RF power supply systems 80 and 82a, 82b, ... 82n connected to upper electrode 62 and segmented electrode 70 and the electrode segments 72a, 72b, ... 72n therein. This process creates confined plasma 36, which glows and emits light in the wavelength range from the IR to the ultra-violet (UV). The precise nature of the optical emissions from plasma 36 depends on the gas used to form the plasma, and the nature of the chemical reactions that take place at the surface of wafer 50. At this point, ends 180 of fiber optic sensors 176 arranged within electrode assembly 60 and facing interior region 30 receive light from plasma 36 and transmit this light to end 178, which is coupled to sensor array detector 172.

Figure 9:
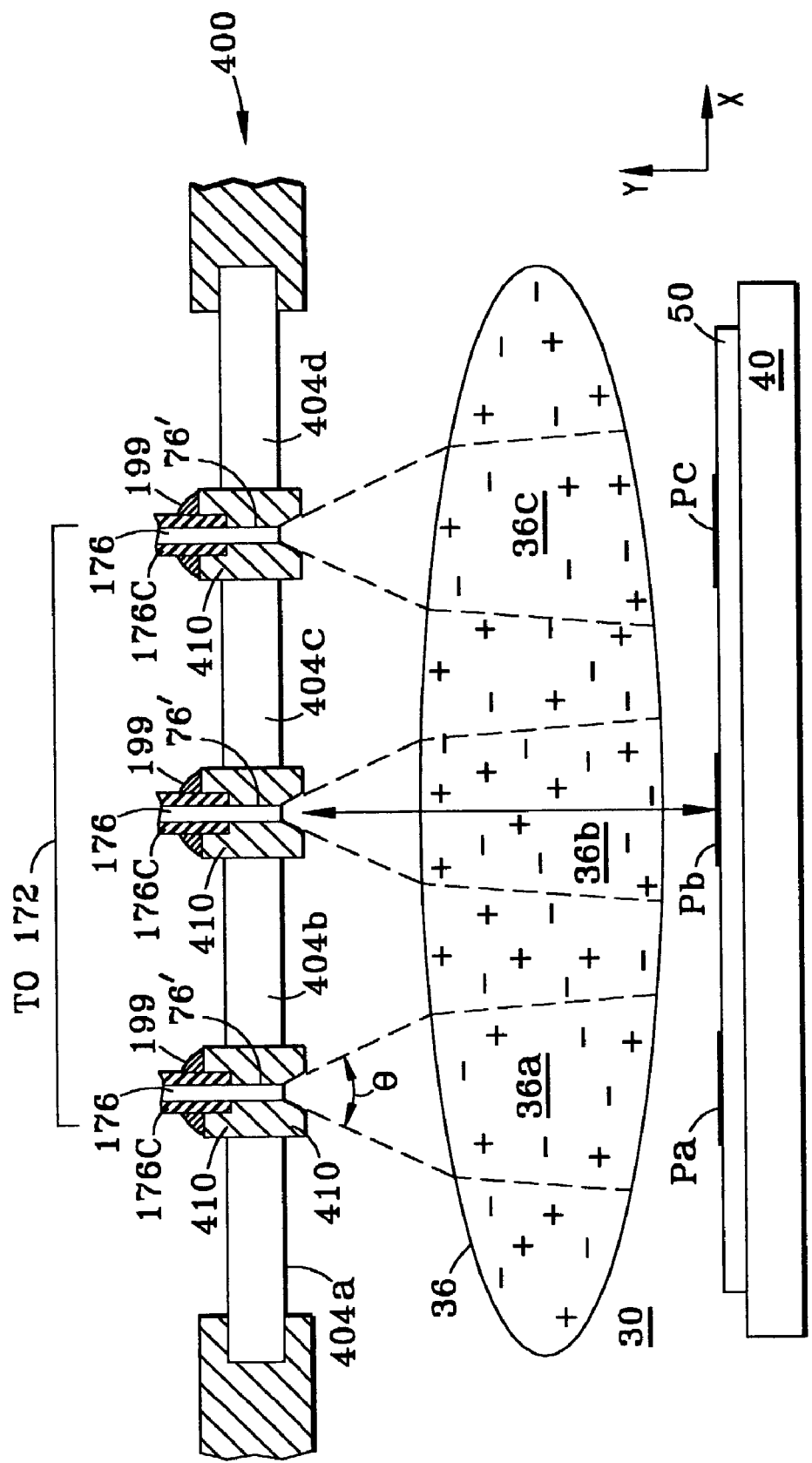
FIG. 9 is a cross-sectional schematic view illustrating an array of fiber optic sensors incorporated into an electrode assembly having a segmented electrode, wherein the fiber optic sensor array is arranged so that the optical emissions from the plasma are monitored at multiple locations in a direction along the wafer, with the received optical emissions being integrated in a direction substantially normal to the wafer being processed.

With reference now also to FIG. 9, by positioning multiple fiber optic sensors 176 along the X-direction parallel to the surface of wafer 50 to receive light from plasma 36, information about different regions across the plasma can be collected by examining the nature of the light emitted by the plasma. Since sensors 176 are located above substrate 50 with plasma 36 therebetween, the spectral information collected is a Y-direction integrated measure of the region of plasma 36 between the sensor in electrode assembly 60 and a portion of substrate 50. This allows the plasma processing across the surface of the substrate 50 to be monitored at n selected points having coordinates $(X_j, Z_j)$ where Z is orthogonal to X and Y, and j=1, 2, ..., n. In this way, end-point detection of the plasma process is not based on an integrated average of the plasma optical emissions in the X-direction (i.e., across the wafer), but on the optical emissions from one or more portions of the substrate. This is important if the plasma processing is not uniform across the surface of substrate 50, which is often the case.

With continuing reference to FIG. 9, fiber optic sensor 176 has a view angle θ at sensor end 180, as discussed above. Further, sensor 176 is typically located a distance d from substrate 50 of about 1 to 20 centimeters, and preferably from about 1 cm to 3 cm, so that the fields of view of 176 sensors cover respective circular portions Pa, Pb, Pc, Pd, on the substrate, each circular portion having a diameter D=2 d tan (θ/2), which can range, for example, from about 1 to 5 cm, based on reasonable ranges for d and θ. Thus, if sensors 176 are located at a distance d of 2 cm, the field of view of fiber optic sensors 176 will cover sufficiently small portions Pa-Pc (or more generally, Pa, Pb, ... Pn) of substrate 50 and will accept light from intervening plasma 36 for the purpose of analyzing the properties of plasma 36 as a function of position (X, Z) on the surface of substrate 50. Also, sensors 176 are preferably spaced far enough apart such that there is little or no overlap of the fields of view of the sensors and thus little or no overlap of portions Pa-Pc on substrate 50. If some of the electrode segments 404a-404d of segmented electrode 400 are disconnected from their corresponding RF power supplies, the effect on plasma 36 in interior region 30 beneath particular electrode segments can be assessed by analyzing the optical signal from sensors receiving light from these areas of the plasma.

With reference again to FIG. 4, as discussed above, the light received from plasma 36 at each sensor end 180 is transferred through fiber optic sensor 176 and emanates from sensor end 178. This light irradiates light dispersing element 184, which disperses the light into its wavelength components. The light is then incident on detector array 188, which converts the optical spectrum incident thereon into an electrical signal representative of the optical spectrum. The data is digitized in the process, and the digitized spectrum is transmitted via an electrical signal to control system 200 in electronic communication therewith (e.g., via a standard computer bus) for subsequent analysis, as described below.

The spectral information collected by each sensor 176 is in response to light emissions from the plasma that are integrated only in a direction nominally perpendicular to the surface of substrate 50 (i.e., not integrated with respect to any direction substantially parallel to the surface of substrate 50) and thus provides a two dimensional spectral view of plasma 36. This information can be used to determine relative process conditions across substrate 50 and to alter the processing to achieved desired process conditions. For example, the wavelength and intensity of the light emitted by plasma 36 is determined by the gas species present in plasma 36 and by the degree of excitation. Each species will have a different signature, where the signature will be due to emission peaks specific to each species. A properly tuned plasma 36 will have emission peaks distributed according to the species present in the process recipe, and the magnitude of the total power spectrum for the light detected from each sensor should be the same for all corresponding portions (regions) of the wafer (e.g., portions Pa-Pc in FIG. 9). For example, if the magnitude of the power spectrum is low in a region of the plasma corresponding to a particular electrode segment (which are also distributed along the X-direction), then the power being delivered to that electrode segment may be too low. Accordingly, controller 200 sends an electronic signal to the corresponding RF power supply to increase power to that electrode segment.

Thus, a method for controlling the power in a plasma across the wafer in a plasma reactor during processing includes the steps of: (1) sensing, using a plurality of fiber optic sensors 176, the emission spectra for a corresponding plurality of regions of plasma 36 and subtracting the background signal for each emission spectrum so detected; (2) calculating the power spectrum; (3) integrating the power across the wavelength region of interest for each sensor; (4) comparing the integrated power obtained in step (3) with predetermined values for each sensor; (5) having controller 200 adjust the RF power being delivered to each electrode segment until the integrated power detected by each sensor 176 is within a predetermined amount of the desired power; and 6) repeating steps (1)-(5) until the process is complete.

Method for Controlling the Gas Flow Across the Wafer During Processing

If the plasma process is abnormal, for example due to a reduced flow of one of the gas species that is part of the process recipe, then the spectral signature will change. In this case, the deviation of the amount of each species from what should be present can be detected and appropriate steps taken. If the emission peaks for some of the species are at a correct magnitude, but are incorrect for others, then an adjustment in the mass flow controllers is indicated.

Thus, a method for controlling the gas flow being delivered into a plasma across the surface of the wafer in a plasma reactor during processing includes the steps of: (1) sensing the emission spectra in plasma 36 for a plurality of regions of plasma 36 (e.g., FIG. 9, regions 36a-36c) using fiber optic sensors 176 and subtracting the background signal; (2) calculating the power spectrum; (3) identifying the magnitude of the power spectrum at predetermined wavelengths corresponding to specific gases present; (4) comparing the magnitudes of selected peaks to predetermined values; (5) adjusting the gas flow corresponding to any emission spectrum that differs from the predetermined amount if the deviation is greater than a previously agreed upon value (e.g. 5%); (6) repeating steps (1)-(5) until the process is complete. The gas flow may be controlled, for example, by control system 200 controlling displacement actuator control system 360 (FIG. 8), which changes the flow of gas from nozzle units 250 into interior region 30.

Method for Detecting Endpoint and Improving Overall Uniformity

Emission lines corresponding to the by-products of etching will provide an indication of the etch rate. This can be done by calibrating the etch depth with the emission signal from an etch by-product. In operation, such a signal will remain essentially constant until endpoint is reached, at which time it will change. Threshold methods can be used to trigger a "stop process" signal. Since the information required to determine the endpoint is available at each sensor, then each sensor can determine endpoint for the portion of the wafer it views. The endpoint signal can then be used to change the process conditions for just the electrode segment that affects the portion Pa-Pc of wafer 50. An example of a suitable change in process would be to have control system 200 reduce the power to that electrode segment.

Thus, a method for detecting endpoint and improving overall uniformity in a plasma reactor includes the steps of: (1) sensing the emission spectra for different regions of plasma 36 (e.g., regions 36a-36c) with corresponding fiber optic sensors 176 and subtracting the background signal from each sensor signal; (2) calculating the power spectrum for each plasma region; (3) identifying the magnitude of the power spectrum at predetermined wavelengths corresponding to specific gases present for each sensor 176 (i.e., for each plasma region); (4) comparing the magnitude of the power spectrum obtained in step (3) to a predetermined criterion for each sensor; (5) if the predetermined criterion is satisfied, then reducing the power to that electrode corresponding to the sensor; (6) repeating steps (1)-(5) until all sensors 176 satisfy the criterion; and (7) stopping the process.

As stated above, the gas flow may be altered using the method described for conventional gas orifices in co-pending Provisional U.S. Patent Application No. 60/149,177, filed Aug. 17, 1999, and entitled PULSED PLASMA PROCESSING METHOD AND APPARATUS, and Provisional U.S. Patent Application No. 60/185,069, cited earlier herein, which patent applications are incorporated by reference herein, and the method for adjustable nozzles in the concurrently filed, co-pending U.S. Provisional Patent Application No. 60/149,177, referenced above.

Method for Improving Overall Plasma Processing Uniformity

If the endpoint signals from the various sensors 176 consistently indicate that particular portions of a wafer reach the plasma processing endpoint ahead of others, then this knowledge can be used to pre-condition the process so that all portions of the wafer reach an endpoint at the same time. A way to accomplish this is to reduce the power to a given electrode segment by a predetermined amount (e.g. by 10%) for portions of the wafer that reach the endpoint ahead of the rest of substrate 50. For portions of the wafer (e.g., one of portions Pa-Pc) that take longer to reach endpoint than the bulk of the wafer, control system 200 can increase power to the corresponding electrode segment by a predetermined amount (e.g. by 10%). Both of these values can be adjusted so that wafer 50 reaches the endpoint at the same time for all portions of the wafer. It the change in power being delivered to a given electrode segment adversely affects the overall performance, then the RF power supply is tuned accordingly.

Thus, a method for improving overall plasma processing uniformity of a wafer includes the steps of: (1) assessing the time to endpoint in each of a plurality of portions of a wafer; (2) loading the next wafer to be processed; (3) adjusting the power being delivered to each electrode segment by an amount that is proportional to the difference in time to the endpoint of a previously processed wafer; (4) sensing the emission spectra for each sensor in the system and subtracting the background signal from each sensor signal; (5) calculating the power spectrum for each sensor; (6) identifying the magnitude of the power spectrum at predetermined wavelengths corresponding to specific gases present for each sensor; (7) comparing the magnitude of the power spectrum obtained in step (6) to a predetermined criterion for each fiber optic sensor; (8) if the predetermined criterion is satisfied, then reducing the power to the particular electrode segment corresponding to the sensor, and balancing the RF power supplies accordingly; (9) repeating steps (4)-(8) until all sensors satisfy the criterion; and (10) stopping the process when suitable uniformity is achieved.

The information obtained during wafer processing can therefore be used as a feedback signal to correct for process deviations via control system 200. If there is a deviation in power, it can be detected and corrective action taken. If there is a deviation in gas flow from a normal process, that deviation can be detected and appropriate action taken. If there is a change in the concentration of one species where that change corresponds to the onset of the end of a process, that condition can be detected and an endpoint process sequence initiated. Therefore, the process conditions in a reactor can be controlled and endpoint detected. These adjustments can take place in real time, thereby avoiding loss of product and minimizing the time to troubleshoot and correct problems.

Thus, with reference again to FIG. 9, an array of fiber optic sensors 176 are, for example, integrated into a segmented electrode 400 having electrode segments 404a-404d separated by insulating members 410 having sensor bores 76' formed therethrough. The plasma optical monitoring system of the present invention provides a way of obtaining a two dimensional view of plasma 36 by having such an array of sensors 176, each of which corresponds to a different portion Pa-Pc of wafer 50 and to corresponding region 36a-36c of plasma 36. This allows for assessing variations in the properties of plasma 36 over the extent of the plasma and correlating the variations to portions Pa-Pc of wafer 50, as described above. Placement of fiber optic sensors 176 is such that they do not extend into interior region 30 and thus do not interfere significantly with the flow of gas into the interior region, so that there is essentially no interference with the regular operation of plasma reactor system 10. Analyzing data from these sensors thus provides information about the spatial variation of plasma 36 as a function of position (X, Z) on the wafer surface, and hence information about the uniformity of the plasma process across the wafer. The time to process the data obtained by fiber optic sensors 176 is very short, so that real time feedback of plasma processing conditions is realizable. This greatly reduces the amount of time it takes to analyze and refine a particular plasma process. Further, the present invention can be used to increase plasma control to enhance etching or deposition uniformity, in particular by adjusting the power to one or more electrode segments, based on the magnitude of the power spectrum associated with each sensor output, to improve plasma uniformity, or by adjusting gas flow based on the relative magnitudes of the power spectra associated with the different sensor outputs.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Moreover, the method and apparatus of the present invention, like related apparatus and methods used in the semiconductor arts that are complex in nature, are often best practiced by empirically determining the appropriate values of the operating parameters, or by conducting computer simulations to arrive at best design for a given application. Accordingly, all suitable modifications and equivalents should be considered as falling within the spirit and scope of the invention.

What is claimed is:

1. A plasma processing system for controlling the processing of a substrate with a plasma, the system comprising:
   a) a plasma reactor chamber capable of containing the plasma;
   b) a substrate pedestal for supporting the substrate;
   c) a segmented electrode assembly arranged within said chamber adjacent said substrate, said assembly having a plurality of electrode segments;
   d) a gas supply system in pneumatic communication with a plurality of bores in said segmented electrode assembly to supply gas to said plasma reactor chamber;
   e) a plurality of RF power supplies, each said supply electrically connected to a corresponding one of said electrode segments;
   f) a plurality of fiber optic sensors integrated into said plurality of bores in said electrode assembly, each of said sensors having first and second ends, said second ends arranged to receive light from respective regions of the plasma and transmit said light to said first ends;
   g) a plurality of support members supporting said plurality of fiber optic sensors in said plurality of bores, said plurality of support members each defining at least one aperture permitting the gas to pass through the plurality of bores in which the plurality of fiber optic sensors are integrated;
   h) a sensor array system arranged to receive light from said first ends of said fiber optic sensors and to convert said light into an electronic output signal corresponding to the spectral content of said light as a function of position across the plasma; and
   i) a control system in electrical communication with said sensor array system and said plurality of RF power supplies, for controlling the RF power to said electrode segments based on said electronic output signal from said sensor array system;
   wherein each of the plurality of support members comprise a cylindrical body with an axial bore passing therethrough to accommodate at least one of said plurality of fiber optic sensors therein and a mounting plate extending radially from said cylindrical body, said mounting plate defining said at least one aperture permitting the gas to pass therethrough.

2. A system according to claim 1, further comprising:
   a) a vacuum system electronically connected to said controller and in pneumatic communication with said plasma chamber;
   b) an electrode chamber for containing a flowing cooling fluid; and
   c) a cooling system in fluid communication with said electrode chamber and in electronic communication with said control system;
   wherein said gas supply system is in electronic communication with said control system.

3. An electrode assembly for a plasma reactor system for processing a substrate with a plasma, the electrode comprising:
   a) a plurality of substantially planar, electrode segments arranged adjacent one another and arranged to be substantially parallel to the substrate when said segments are installed in the reactor system;
   b) insulating members, arranged between said electrode segments, each one of a plurality of sensor bores being formed therein;
   c) a plurality of fiber optic sensors each having first and second ends, with said second ends held within respective sensor bores such that said second ends receive light from respective regions of the plasma; and
   d) a plurality of support members supporting said plurality of fiber optic sensors in said plurality of sensor bores, said plurality of support members each defining at least one aperture permitting the gas to pass through the plurality of sensor bores in which the plurality of fiber optic sensors are held
   wherein each of the plurality of support members comprise a cylindrical body with an axial bore passing therethrough to accommodate at least one of said plurality of fiber optic sensors therein and a mounting plate extending radially from said cylindrical body, said mounting plate defining said at least one aperture permitting the gas to pass therethrough.

4. A system according to claim 1, wherein said mounting plate has a disk shape.

5. A system according to claim 1, wherein said mounting plate comprises a plurality of spokes extending outwardly from said cylindrical body.

* * * * *